(12) United States Patent
Wyse et al.

(10) Patent No.: US 9,537,558 B1
(45) Date of Patent: Jan. 3, 2017

(54) ESA PHASE SHIFTER TOPOLOGY

(71) Applicants: Russell D. Wyse, Center Point, IA (US); Michael L. Hageman, Mount Vernon, IA (US)

(72) Inventors: Russell D. Wyse, Center Point, IA (US); Michael L. Hageman, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 61 days.

(21) Appl. No.: 14/663,641

(22) Filed: Mar. 20, 2015

(51) Int. Cl.
| | | |
|---|---|---|
| *H01Q 3/36* | (2006.01) |
| *H04B 7/06* | (2006.01) |
| *H04B 1/04* | (2006.01) |
| *H03F 3/19* | (2006.01) |
| *H03G 3/00* | (2006.01) |
| *H01Q 1/00* | (2006.01) |
| *H01Q 3/38* | (2006.01) |

(52) U.S. Cl.
CPC ............. *H04B 7/0682* (2013.01); *H03F 3/19* (2013.01); *H03G 3/00* (2013.01); *H04B 1/0483* (2013.01); *H01Q 1/00* (2013.01); *H01Q 3/36* (2013.01); *H01Q 3/38* (2013.01); *H03F 2200/336* (2013.01); *H04B 2001/0408* (2013.01)

(58) Field of Classification Search
CPC ............. H04B 7/00; H04B 1/00; H04B 1/02; H04B 2001/0408; H04B 1/0483; H04L 27/20; H04L 5/00; H03F 3/24; H03F 3/19; H03F 2200/336; H03G 3/00; H01Q 3/36; H01Q 1/00
See application file for complete search history.

(56) References Cited

U.S. PATENT DOCUMENTS

| | | | | |
|---|---|---|---|---|
| 4,835,493 | A * | 5/1989 | Walsh, Jr. ............... | H03C 1/50 332/151 |
| 7,881,402 | B2 * | 2/2011 | Gao ...................... | H04L 25/061 327/291 |
| 8,203,394 | B2 * | 6/2012 | Kim ..................... | H04B 7/0617 332/103 |
| 8,903,342 | B1 | 12/2014 | Wyse et al. | |
| 8,937,495 | B1 | 1/2015 | Wyse et al. | |
| 2003/0072389 | A1 * | 4/2003 | Li ........................... | H03D 7/14 375/308 |
| 2003/0141938 | A1 * | 7/2003 | Poklemba .............. | H04L 27/02 332/103 |

(Continued)

*Primary Examiner* — Jean B Corrielus
(74) *Attorney, Agent, or Firm* — Donna P. Suchy; Daniel M. Barbieri

(57) ABSTRACT

A phase shifter component is described. Inputs are arranged to selectively receive an inphase component of an in-phase (I) signal or an outphase I signal 180° out of phase with the inphase I signal, and to selectively receive an inphase component of a quadrature-phase (Q) signal or an outphase Q signal 180° out of phase with the inphase Q signal. A first gain portion includes only two transistor elements arranged to amplify the received outphase or inphase I signal. A second gain portion includes only two transistor elements arranged to amplify the received outphase or inphase Q signal. The first and second gain portions are configured to control the gain of the received outphase or inphase I signal and the received outphase or inphase Q signal, respectively, to provide a composite output signal with a desired phase shift between 0° and 360°.

20 Claims, 6 Drawing Sheets

(56) References Cited

U.S. PATENT DOCUMENTS

| | | | | |
|---|---|---|---|---|
| 2004/0263242 | A1* | 12/2004 | Hellberg | H03F 1/0294 330/2 |
| 2006/0181344 | A1* | 8/2006 | Ksienski | H03F 1/26 330/124 R |
| 2009/0262037 | A1* | 10/2009 | Matyas | H01Q 19/12 343/779 |
| 2012/0155573 | A1* | 6/2012 | Pruvost | H03H 11/22 375/302 |
| 2012/0207252 | A1* | 8/2012 | Levesque | H02M 3/07 375/342 |
| 2013/0033296 | A1* | 2/2013 | Kishimoto | H01P 1/18 327/237 |
| 2013/0088391 | A1* | 4/2013 | Corman | H04B 7/10 342/365 |

* cited by examiner

ESA PHASE SHIFTER TOPOLOGY

BACKGROUND

The present disclosure relates generally to phase shifter topology. More particularly, the present application relates to a phase shifter topology that may be used in an electronically scanned array (ESA) and in other devices that require precision phase control.

In known phase shifter topology, the phase shifter divides the amplified signal from a variable amplitude controller into an in-phase (I) signal and quadrature-phase (Q) signal. The variable amplitude controller provides amplitude shaping of the signal, while the quadrature phase shifter provides for 0-180° quadrant control for the I and Q signals to achieve full 360° control. In this topology, the quadrature phase shifter has two sets of transistor pairs for the I input to create the differential in-phase signals I+ and I−, and two sets of transistor pairs for the Q input to create the differential quadrature-phase signals Q+ and Q−, for a total of eight transistors.

For the eight transistor phase shifter design, the necessity to perform the 0-180° quadrant control for the I and Q signals requires additional voltage overhead due to vertical transistor stacking. Further, the necessity to perform the outphase of the I and Q signals requires extra parasitic loading on the inputs, because only two of the four transistors in each cell are actively biased on at any point depending on the quadrant selected.

SUMMARY OF THE INVENTION

According to one embodiment of the invention there is provided a phase shifter topology circuit. The circuit comprising: an I/Q generator configured to receive an input signal, and generate an in-phase (I) signal and a quadrature-phase (Q) signal based on the input signal; a first variable amplitude amplifier arranged to receive the I signal from the I/Q generator, and configured to adjust the phase of and amplify the I signal to provide an inphase I signal or an outphase I signal 180° out of phase with the inphase I signal; a second variable amplitude amplifier arranged to receive the Q signal from the I/Q generator, and configured to adjust the phase of and amplify the Q signal to provide an inphase Q signal or an outphase Q signal 180° out of phase with the inphase Q signal; and a phase shifter component arranged to selectively receive the outphase I signal or the inphase I signal from the first variable amplitude amplifier and to selectively receive the outphase Q signal or the inphase Q signal from the second variable amplitude amplifier, and configured to control the gain of the received outphase or inphase I signal and the received outphase or inphase Q signal to provide a composite output signal with a desired phase shift between 0° and 360°.

According to one aspect of the embodiment, the phase shifter component comprises: a first gain portion comprising only two transistor elements arranged to amplify the received outphase or inphase I signal; and a second gain portion comprising only two transistor elements arranged to amplify the received outphase or inphase Q signal.

According to another aspect of the embodiment, each of the transistor elements of the first and second gain portions comprises three transistors configured to be a super transistor.

According to another aspect of the embodiment, the first variable amplitude amplifier has a first gain portion configured to amplify the I signal, and the second variable amplitude amplifier has a second gain portion configured to amplify the Q signal.

According to another aspect of the embodiment, the first gain portion comprises two pairs of transistors cross coupled with each other, and the second gain portion comprises two pairs of transistors cross coupled with each other.

According to another aspect of the embodiment, each of the transistors of the pairs of transistors of the first and second gain portions comprises three transistors configured to be a super transistor.

According to another aspect of the embodiment, the circuit further comprises a control circuit configured to provide control signals to the first and second variable amplitude amplifiers and the phase shifter component to control the amplification provided by the first and second variable amplitude amplifiers and the phase shifter component.

According to another aspect of the embodiment, the first variable amplitude amplifier has a first control portion configured to provide current to the transistors of the first gain portion to control the amplification provided by the first gain portion, and the second variable amplitude amplifier has a second control portion configured to provide current to the transistors of the second gain portion to control the amplification provided by the second gain portion.

According to another aspect of the embodiment, the phase shifter component has a first control portion configured to provide current to the transistors of the first gain portion to control the amplification provided by the first gain portion, and a second control portion configured to provide current to the transistors of the second gain portion to control the amplification provided by the second gain portion.

According to another embodiment of the invention there is provided a phase shifter component. The phase shifter component comprises: inputs arranged to selectively receive an inphase component of an in-phase (I) signal or an outphase I signal 180° out of phase with the inphase I signal, and to selectively receive an inphase component of a quadrature-phase (Q) signal or an outphase Q signal 180° out of phase with the inphase Q signal; a first gain portion comprising only two transistor elements arranged to amplify the received outphase or inphase I signal; and a second gain portion comprising only two transistor elements arranged to amplify the received outphase or inphase Q signal, and the first and second gain portions configured to control the gain of the received outphase or inphase I signal and the received outphase or inphase Q signal, respectively, to provide a composite output signal with a desired phase shift between 0° and 360°.

According to one aspect of the embodiment, each of the transistor elements of the first and second gain portions comprises three transistors configured to be a super transistor.

According to another aspect of the embodiment, the component further comprises: a first control portion configured to provide current to the transistors of the first gain portion to control the amplification provided by the first gain portion, and a second control portion configured to provide current to the transistors of the second gain portion to control the amplification provided by the second gain portion.

According to another embodiment of the invention there is provided an electronically scanned antenna array. The electronically scanned antenna array comprises: a plurality of antenna elements configured to transmit a beam comprising signals emitted by the antenna elements; and a plurality of phase shifter topology circuits configured to adjust the amplitudes of signals provided to the antenna elements for emission, wherein each phase shifter topology circuit comprises: an I/Q generator configured to receive an input signal, and generate an in-phase (I) signal and a quadrature-phase (Q) signal based on the input signal; a first variable amplitude amplifier arranged to receive the I signal from the I/Q generator, and configured to adjust the phase of and amplify the I signal to provide an inphase I signal or an outphase I signal 180° out of phase with the inphase I signal; a second variable amplitude amplifier arranged to receive the Q signal from the I/Q generator, and configured to adjust the phase of and amplify the Q signal to provide an inphase Q signal or an outphase Q signal 180° out of phase with the inphase Q signal; and a phase shifter component arranged to selectively receive the outphase I signal or the inphase I signal from the first variable amplitude amplifier and to selectively receive the outphase Q signal or the inphase Q signal from the second variable amplitude amplifier, and configured to control the gain of the received outphase or inphase I signal and the received outphase or inphase Q signal to provide a composite output signal with a desired phase shift between 0° and 360°.

According to one aspect of the embodiment, the phase shifter component comprises: a first gain portion comprising only two transistor elements arranged to amplify the received outphase or inphase I signal; and a second gain portion comprising only two transistor elements arranged to amplify the received outphase or inphase Q signal.

According to another aspect of the embodiment, each of the transistor elements of the first and second gain portions comprises three transistors configured to be a super transistor.

According to another aspect of the embodiment, the first variable amplitude amplifier has a first gain portion configured to amplify the I signal, and the second variable amplitude amplifier has a second gain portion configured to amplify the Q signal.

According to another aspect of the embodiment, the first gain portion comprises two pairs of transistors cross coupled with each other, and the second gain portion comprises two pairs of transistors cross coupled with each other.

According to another aspect of the embodiment, each of the transistors of the pairs of transistors of the first and second gain portions comprises three transistors configured to be a super transistor.

According to another aspect of the embodiment, the array further comprises a control circuit configured to provide control signals to the first and second variable amplitude amplifiers and the phase shifter component to control the amplification provided by the first and second variable amplitude amplifiers and the phase shifter component.

According to another aspect of the embodiment, the phase shifter component has a first control portion configured to provide current to the transistors of the first gain portion to control the amplification provided by the first gain portion, and a second control portion configured to provide current to the transistors of the second gain portion to control the amplification provided by the second gain portion.

DETAILED DESCRIPTION

ESA

Figure 1:
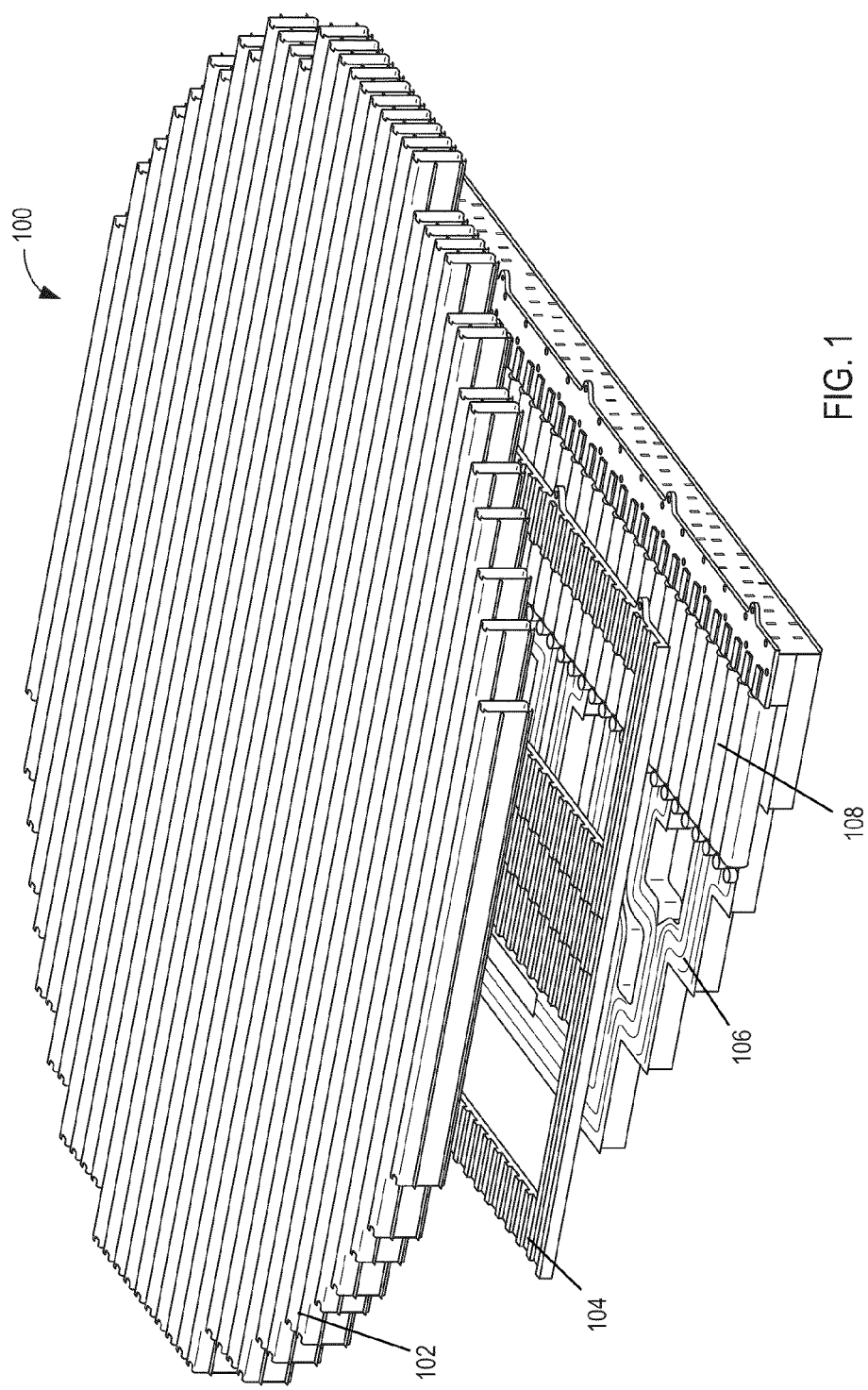
FIG. 1 is an exploded view of an electronically scanned array, according to an exemplary embodiment.

Referring now to FIG. 1, an exploded view of an ESA 100 is shown, according to an exemplary embodiment. In one embodiment, ESA 100 is a one-dimensional antenna array (a planar 2D array that scans in one direction) and may be an edge slotted waveguide antenna. In other embodiments, ESA 100 is a multi-dimensional antenna array. Also referred to as a phased array or phased antenna array, an ESA such as ESA 100 may be configured to direct a beam in any number of different directions without mechanically altering its positions. For example, ESA 100 may be in an upright position and perform radar scans in any number of vertical or horizontal directions, without mechanically changing the orientation of ESA 100.

As shown, ESA 100 includes an array of elements 102 which function to direct radio frequency waves (e.g., microwaves, ultra-high frequency waves, etc.) away from ESA 100 or to receive radio frequency waves. In one embodiment, ESA 100 may be used in a radar system to transmit a radar beam and to receive radar returns. In other embodiments, ESA 100 may be used in a communications system to transmit or receive communication signals. For example, ESA 100 may be used in a satellite communication system to transmit data to a remote location or receive data from the remote location. ESA 100 may be of any number of different shapes or forms. For example, ESA 100 may be circular, square, rectangular, elliptical, or may be another shaped contour. ESA 100 also includes a feed manifold 106 and a mounting frame 104 for coupling elements 102 to feed manifold 106. According to an exemplary embodiment, feed manifold 106 and the array of elements 102 are easily separable, allowing for individual testing and repairing. Coupled to the array of elements 102 are phase shifter topology circuits 108, which adjust the phase and amplitude of the transmitted and received signals. By controlling the phase and amplitudes of the transmitted signals, for example, the direction of the beam emitted from ESA 100 may be adjusted without having to mechanically move ESA 100.

Figure 2:
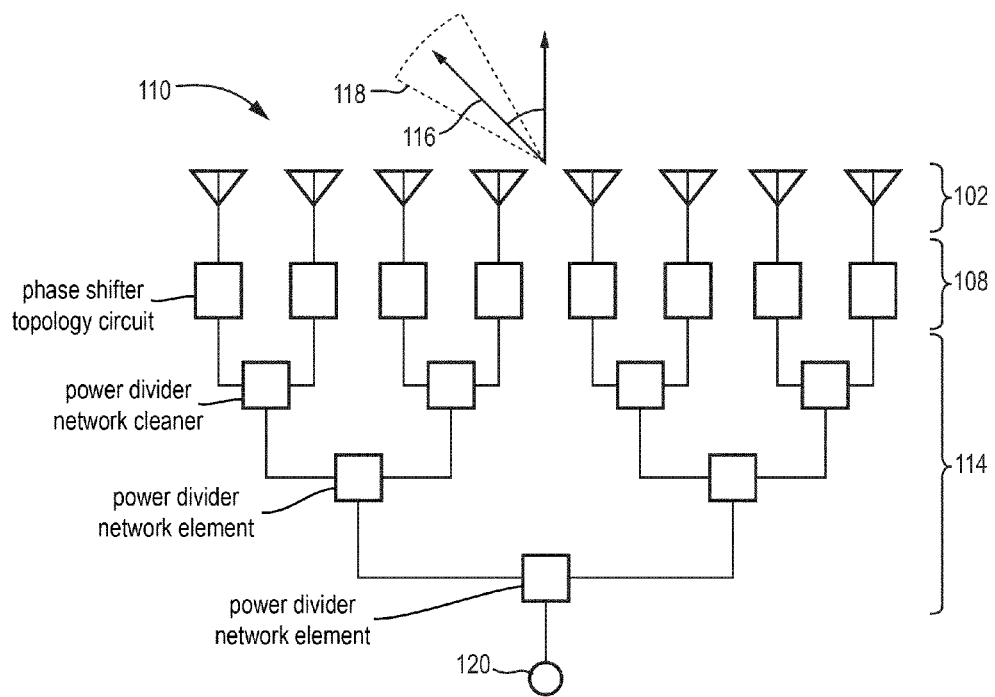
FIG. 2 is a schematic illustration of a row of elements of the electronically scanned array shown in FIG. 1, according to an exemplary embodiment.

Referring now to FIG. 2, a schematic illustration 110 is shown of a row of elements of the ESA 100 shown in FIG. 1, according to an exemplary embodiment. As shown, the elements 102 of ESA 100 may be arranged in rows. According to some embodiments, each row of elements 102 may receive a signal from a signal source 120, which generates a radio frequency signal to be emitted from ESA 100 by elements 102. A power divider network 114 may divide the signal generated by signal source 120 and route the divided signals to elements 102. Coupled to elements 102 and power divider network 114 are phase shifter topology circuits 108, which are configured to transmit the signals received from signal source 120 via elements 102 or route signals received from elements 102. In various embodiments, phase shifter topology circuits 108 may control the direction of a beam emitted by elements 102 by controlling the phase and amplitudes of the signals provided to the individual elements 102 by power divider network 114.

Elements 102 may be separated by a uniform distance (d), according to one embodiment. The individual signals emitted by elements 102 may combine to form a beam 116 directed along a direction 118. Beam 116 may be emitted as a broadside beam orthogonal to ESA 100 (e.g., angle θ=0) when the phase shift (φ) produced by phase shifter topology circuits 108 is also zero. To direct beam 116 at a different direction, such as along direction 118, phase shifter topology circuits 108 may produce phase shifts as follows:

$$\phi_n = nkd \cdot \sin(\theta)$$

where n is the nth element in the row of elements 102, $\phi_n$ is the phase excitation of the nth element in the row of elements 102, d is the distance between elements 102 in the row, θ is the angle of beam 116 when directed along direction 118, and k is the wave number (e.g., $2\pi/\lambda$) of the emitted signal having a wavelength λ. In some embodiments, phase shifter topology circuits 108 may also control the amplitudes of their respective signals, to control the resulting shape of beam 116 and its sidelobes.

Phase Shifter Topology Circuit

Figure 3:
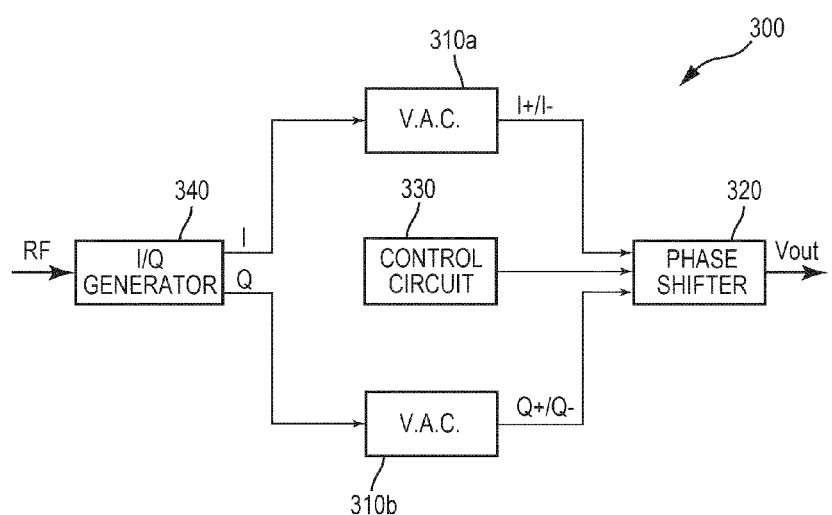
FIG. 3 is a schematic of a phase shifter topology circuit, according to an exemplary embodiment.

Referring now to FIG. 3, a schematic diagram is shown of a phase shifter topology circuit 300, according to an exemplary embodiment. In some embodiments, phase shifter topology circuit 300 may be used in an ESA (e.g., as one of the phase shifter topology circuits 108 shown in FIG. 1B). In other embodiments, phase shifter topology circuit 300 may be used in other applications, such as high-frequency communication devices, wireless data networking devices, motor controllers, and the like.

The phase shifter topology circuit 300 includes an I/Q generator 340 which receives an RF input signal, and generates an in-phase signal I, and quadrature phase signal Q based on the RF input signal.

The phase shifter topology circuit 300 further includes a pair of variable amplitude controllers 310a and 310b, each variable amplitude controller having an input receiving one of the in-phase signal I or quadrature-phase signal Q from the I/Q generator 340. In particular, the variable amplitude controller 310a receives the in-phase signal I as an input, while the variable amplitude controller 310b receives the quadrature-phase signal Q as an input.

The variable amplitude controllers 310a and 310b provide output signals with amplitude control and 180° phase control ($I_+$ or $I_-$ for controller 310a, and $Q_+$ or $Q_-$ for controller 310b) which are input by the phase shifter component 320. $I_+$ is 180° out of phase with $I_-$, and $Q_+$ is 180° out of phase with $Q_-$. This arrangement fine tunes the amplitude of I and Q to supplement the gain control in the phase shifter 320 for what the phase shifter 320 does with I and Q, thereby providing increased resolution capability. The variable amplitude controllers 310a and 310b are each configured to adjust the amplitude of their input signal, and further to adjust the phase of their input signal. Each of the variable amplitude controllers 310a and 310b is capable of changing the output phase of its output signal relative to the input phase of its input signal in a 180° step. The arrangement of the amplitude controllers 310a and 310b relative to the phase shifter 320 allows that the phase of the I signal going into the phase shifter 320 can be changed between $I_+$ and $I_-$, and the Q signal can be changed between $Q_+$ and $Q_-$. Thus, this arrangement allows 4 quadrant I/Q signals to be provided from the variable output controllers 310a and 310b to the phase shifter component 320, which may then recreate full 360° phase control.

Quadrature Outputs from Variable Amplitude Controllers

In particular, the variable output controller 310a is configured to adjust the amplitude and phase of its input signal so as to provide signals $I_+$ or $I_-$ at its output. Likewise, the variable output controller 310b is configured to adjust the amplitude and phase of its input signal so as to provide the quadrature-phase signals $Q_+$ or $Q_-$ at its output. Thus, the variable output controllers 310a and 310b are configured to both control the amplitude of the input differential signals I and Q, as well as to adjust the phase so as to provide the quadrature output signals $I_+$, $I_-$, $Q_+$ and $Q_-$.

The phase shifter component 320 receives the differential quadrature signals I+, I−, Q+ and Q− from the variable output controllers 310a and 310b. The phase shifter component 320 combines the quadrature signals $I_+$, $I_-$, $Q_+$ and $Q_-$ to create a composite signal $V_{out}$ whose phase is anywhere between the quadrature signals Q and I, as desired.

Thus, for the phase shifter topology circuit 300, the phase shifter component 320 need not create the quadrature components, $I_+$, $I_-$, $Q_+$ and $Q_-$, which are instead created by the variable output controllers 310a and 310b, which perform phase inversion to create the quadrature components. The quadrature components are fed into the phase shifter component 320, which creates a full 360° phase controlled output.

The phase shifter topology circuit 300 further may have a control circuit 330 providing control signals to each of the variable output controllers 310a and 310b and to the phase shifter component 320. The control circuit 330 may be an on-die CMOS SPI, or DAC, for example. The control circuit 330 may comprise one or more control subcircuits.

Variable Amplitude Controller

Figure 4:
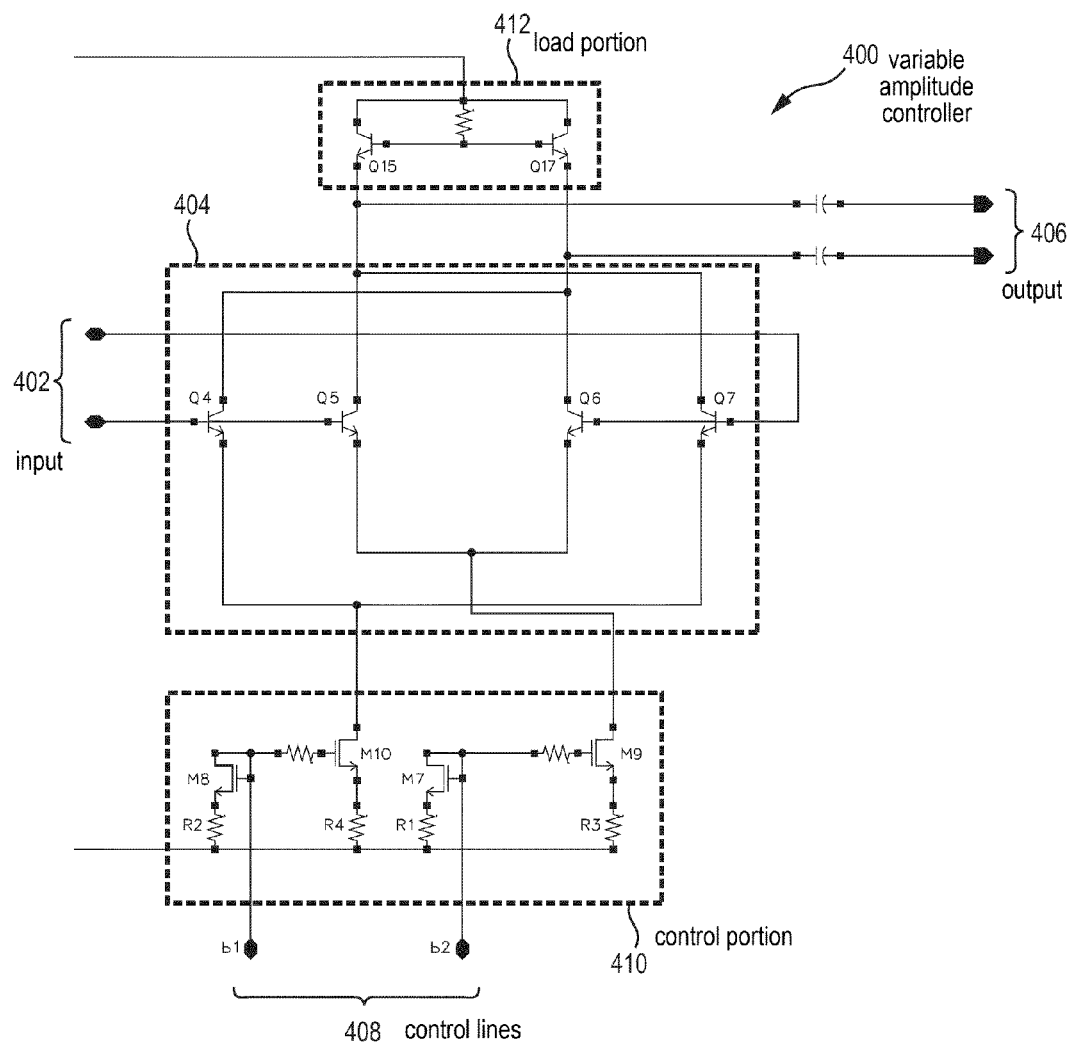
FIG. 4 is a circuit diagram of a variable amplitude controller, according to an exemplary embodiment.

Referring now to FIG. 4, a circuit diagram of a variable amplitude controller 400 is shown, according to an exemplary embodiment. An example of an appropriate variable output controller is described, for example, in U.S. Pat. No. 8,903,342 to Wyse et al., entitled HIGH DYNAMIC RANGE PRECISION VARIABLE AMPLITUDE CONTROLLER, which is incorporated by reference. As shown, the variable amplitude controller allows for selectable control over the amount of attenuation or gain applied to an input signal, V received at input 402. In some embodiments, amplitude controller 400 may be used to control the amplitude of a signal within an ESA. For example, variable amplitude controller 400 may be used in phase shifter topology circuit 300 shown in FIG. 3 (e.g., as variable amplitude controller 310a and/or variable amplitude controller 310b). In general, variable amplitude controller 400 includes a gain portion 404 configured to apply a gain or attenuation to an input signal received via input 402. The amount of gain or attenuation applied by gain portion 404 may be based on a load portion 412 and the particular bias current supplied to gain portion 404 by a control portion 410. In the case that the variable amplitude controller 400 is variable amplitude controller 310a of FIG. 3, the gain portion is controlled to provide signals I+ or I− at its output 406. In the case that the variable amplitude controller 400 is variable amplitude controller 310b of FIG. 3, the gain portion 404 is controlled to provide signals Q+ or Q− at its output 406.

The input signal may be provided by input 402 to the gain portion 404 of amplitude controller 400, which applies a gain or attenuation to the input signal. It is to be understood that attenuation is merely a negative gain and that amplitude controller 400 may be configured to apply either or both of a gain or attenuation to the input signal received at input 402. For example, the size ratio of transistors in load portion 412 and gain portion 404 may be such that a gain is applied by gain portion 404 at maximum settings and an attenuation is applied at lower settings (e.g., if the transistors in load portion 412 are undersized relative to those in gain portion 404). Other size ratios are also contemplated in other embodiments to control the overall gain or attenuation range of variable amplitude controller 400, as well as using resistive, inductive, or other forms of loads in load portion 410. The corresponding output signals from gain portion 404 and load portion 410 (e.g., the lines carrying the differential output signal that result from gain portion 404 adjusting the differential input signal under a load provided by load portion 410) are then provided to output 406, which carries the amplitude-adjusted signal as a differential output signal.

In some embodiments, gain portion 404 may include transistors or other circuit elements configured to apply gains or attenuations to the signals received at input 402. For example, gain portion 404 may include transistors Q4-Q7 configured to adjust the amplitudes of the signals received at inputs 402. As shown, the transistors in gain portion 404 may be cross-coupled with one another to provide differential gains to the input signals. For example, the emitters of transistors Q4, Q7 may be coupled and the emitters of Q5, Q6 may be coupled, thereby forming two transistor pairs (e.g., a first pair, Q4, Q7 and a second pair Q5, Q6). In other words, each transistor in an amplification stage of gain portion 404 may be cross coupled with a corresponding transistor in another amplification stage of gain portion 404. Each of the input lines at input 402 may be connected to a different transistor's base within the transistor pairs (e.g., the V+ line of V is connected to the base of Q7 and the V− line of V is connected to the base of Q4). The collectors of a transistor pair may also be cross-coupled with those of the other pair as part of the differential output lines of outputs 406. For example, the collectors of transistors Q4 and Q6 may be coupled to form the V+ line of output 406 and the collectors of transistors Q5, Q7 may be coupled to form the V− line of output 406.

According to some embodiments, transistors Q4-Q7 are transistors which have approximately linear transconductance to current characteristics. For example, the transistors in gain portion 404 may be bi-junction transistors (BJTs) or heterojunction BJTs (HBTs) that exhibit a transconductance relationship as follows:

$$g_m \cong \frac{I_c}{V_t}$$

where $g_m$ is the transconductance, $I_c$ is the current through the transistor's collector, and $V_t$ is the transistor's thermal voltage ($V_t$=k*T/q, which may be approximately equal to 26 mV at room temperature). The BJTs may be in NPN or PNP configurations, according to various embodiments. In other embodiments, the transistors of gain portion 404 may be field-effect transistors (FETs) or other circuit elements configured to apply controllable gains to the signals received via input 402. Since the transconductance varies linearly with the transistor's current, so too does the amplification provided by the transistor.

Variable amplitude controller 400 also includes a control portion 410 configured to control the gain or attenuation applied by gain portion 404, and to create phase inversion of the input signal, by applying varying currents across transistors Q4-Q7. As shown, control portion 410 includes control lines 408 (e.g., control lines b1 and b2). Control lines 408 may be connected to Transistors M7-M10 in control portion 410, which control the currents supplied to the emitters of transistors of gain portion Q4-Q7. Transistors M7-M10 may be HBTs, in one embodiment. In another embodiment, Transistors M7-M10 may be field effect transistors (FETs) which have zero DC gate current, allowing for lower power consumption. Transistors M7-M10 may also have resistors (e.g., R1-R4) connected to them respectively, to raise the common mode impedance at the drains of transistors M9-M10. In another embodiment, resistors R1-R4 may be omitted and a short used instead. Bias reference currents supplied by control lines 408 may be scaled up by control portion 410 (e.g., based on the ratios between transistors M8/M10 and M7/M9 and their resistor ratios, if used). The scaled up currents may then be provided by control portion 410 to transistors Q4-Q7 of gain portion 404. If the transconductances of transistors Q4-Q7 are proportional to the currents across them, transistors M8-M10 may be controlled to vary the amount of current supplied to gain portion 404 and, hence, the amount of amplitude control applied by gain portion 404. For example, the transistors in control portion 410 may be controlled to prevent the supply of current into either of the sets of cross-coupled transistors in gain portion 404. In other words, control lines b1 and b2 may be used to activate the individual transistor pairs in gain portion 404 to provide current to transistors Q4-Q7, thereby controlling the transistors' respective gains. In various embodiments, control lines 408 may receive control signals from a control circuit via one or more on-die CMOS SPI, or DACs, for example.

In one state of operation, control portion 410 activates only one of the two transistor pairs in gain portion 404 (e.g., either pair Q5, Q6 or pair Q4, Q7). For example, transistors M8, M10 of control portion 410 may be controlled via line b1 of control lines 408 such that no current is provided across transistors Q4, Q7. At the same time, transistors M7, M9 of current mirror portion 410 may be controlled to provide current across transistors Q5, Q6 (e.g., $I_{b1}$=0 and $I_{b2}$=$I_{bmax}$). Since the Q5, Q6 transistor pair is active, a gain may be applied equally to the input signal, thereby generating a maximized output signal at output 406 that has one phase relationship. Such a state corresponds to one extreme of the operational range of variable amplitude controller 400 (e.g., the highest possible amplitude of the output signal). Changing the bias such that $I_{b1}$=$I_{bmax}$ and $I_{b2}$=0 will produce the same maximized output signal, but 180 degrees out of phase compared to the previous bias state.

In another state of operation, control portion 410 activates both of the two transistor pairs in gain portion 404 by providing equal currents to the respective transistor pairs ($I_{b1}$=$I_{b2}$=$I_{bmax}$/2). In such a case, maximum attenuation can be achieved in variable amplitude controller 400 when the gains of the two transistor pairs are equal, thereby canceling out the inputs signals from inputs 402. Since the gains of Q4-Q7 vary approximately linearly with their currents and the currents across them are also equal, their gains are also equal and the cross-coupling of Q4-Q7 at outputs 406 acts to cancel out the input signal. In other words, the maximum attenuation of the input signal by variable amplitude controller 400 can be achieved by controlling lines b1 and b2 in control portion 404 such that equal amounts of current are supplied to the transistor pairs of gain portion 404. Such a state of operation also corresponds to the other extreme of the operational range of variable amplitude controller 400 (e.g., the total cancellation of the input signal). Thus, the amplitude control range of amplitude controller 400 varies from the condition in which only one transistor pair of gain portion 404 is active (e.g., a maximum output signal results) to the condition in which both transistor pairs of gain portion 404 have equal currents across them (e.g., a minimum output signal results).

The phase relationship of the output signal depends on which transistor pair is receiving the most current. For example, if $I_{b1}=51\%$ of $I_{bmax}$ and $I_{b2}=49\%$ of Ibmax, then a very small attenuated signal with one phase relationship is output. On the other hand, if $I_{b1}=49\%$ and $I_{b2}=51\%$ then the same magnitude signal is output, but with a 180° phase difference.

According to various embodiments, variable amplitude controller 400 may include a load portion 412. Load portion 412 may include active or passive circuit elements to provide a load to gain portion 404 (e.g., resistors, an inductive choke, transistors, etc.), in various embodiments. As shown, for example, load portion 412 includes transistors Q15, Q17 which provide loads to transistors Q4-Q7 of gain portion 404. In one embodiment, transistors Q15, Q17 are of the same construction and type as the transistors of gain portion 404. For example, the transistors of load portion 412 and gain portion 404 may be silicon germanium (SiGe) based HBTs, in one implementation. In various embodiments, the size ratio of transistors Q15, Q17 in load portion 412 to transistors Q4-Q7 in gain portion 404 may be selected to adjust the overall range of amplitude control available from the variable amplitude controller 400.

According to various embodiments, the load impedance of load portion 412 may be held constant across both of its transistors Q15, Q17 ($g_{m15}=g_{m17}$) or other elements (e.g., resistors, inductive choke, etc.) throughout the entire range of amplitude control provided by variable amplitude controller 400 based on the cross coupling of transistors Q4-Q7 and control over the currents supplied by control portion 410. In one embodiment, the amplitude control applied by variable amplitude controller 400 may be varied by increasing one of the currents supplied via M8, M10 or via M7, M9, while decreasing the other current in an equal amount. For example, the current supplied to line b1 of control signals 408 may be decreased in an amount equal to an increase in current supplied to line b2 of control signals 408. In such a case, each of the transistors or other elements in load portion 412 may receive the same amount of current across it, thereby also keeping their respective voltage drops constant. The constant voltage drops across load portion 412 also results in the voltages at the collectors of the transistors in gain portion 404 staying the same for all amplitude control conditions. For example, if transistors Q15, Q17 are used in load portion 412, their impedances at the collectors of Q4-Q7 are approximately $1/gm=1/(I_c/V_t)$, if the relationship of Ib1+Ib2=Ibmax is maintained, which remains constant across all control ranges of variable amplitude controller 400. As a result, the total transconductance of each of the combined transistors Q4/Q5 and Q6/Q7 is also held constant across the entire amplitude control range (e.g., $g_{m15}=g_{m17}=g_{m4}+g_{m5}=g_{m6}+g_{m7}$).

The bias current can be chosen to maximize its frequency response to offer a wide band of frequencies for the input signal received at input 402. For example, variable amplitude controller 400 may be capable of handling an input signal bandwidth of up to 20 GHz or more, when SiGe HBTs are used in gain portion 404 and load portion 412.

The phase of the output signal may be changed for the same gain depending on which bias current is bigger. As discussed above, the phase relationship of the output signal depends on which transistor pair is receiving the most current. For example, if $I_{b1}=51\%$ of $I_{bmax}$ and $I_{b2}=49\%$ of Ibmax, then a very small attenuated signal with one phase relationship is output. On the other hand, if $I_{b1}=49\%$ and $I_{b2}=51\%$ then the same magnitude signal is output, but with a 180° phase difference.

Quadrature Outputs from Variable Amplitude Controllers

Referring back to FIG. 3, the variable amplitude controller 310a is configured to adjust the amplitude and phase of its output signal so as to provide differential in-phase signals I+ or I− at its output, and the variable output controller 310b is configured to adjust the amplitude and phase of its output signal so as to provide the differential in-quadrature signals Q+ or Q− at its output. Each of the variable amplitude controllers 310a and 310b is capable of changing the output amplitude and phase of its output signal relative to the differential I or Q input signals Referring back to FIG. 4, the variable amplitude controller 400 is configured to adjust the amplitude and phase of the input signal I to provide output differential signals I+ or I−, by applying an appropriate current from the control portion 410 to the transistor pairs (pair Q5, Q6 and pair Q4, Q7) based on control signals on the control line 408. Similarly, the variable amplitude controller 400 is configured to adjust the amplitude and phase of the differential input signal Q to provide output quadrature-phase signals Q+ or Q−, by applying an appropriate current from the control portion 410 to the transistor pairs (pair Q5, Q6 and pair Q4, Q7) based on control signals on the control line 408.

Phase Shifter Component

Figure 5:
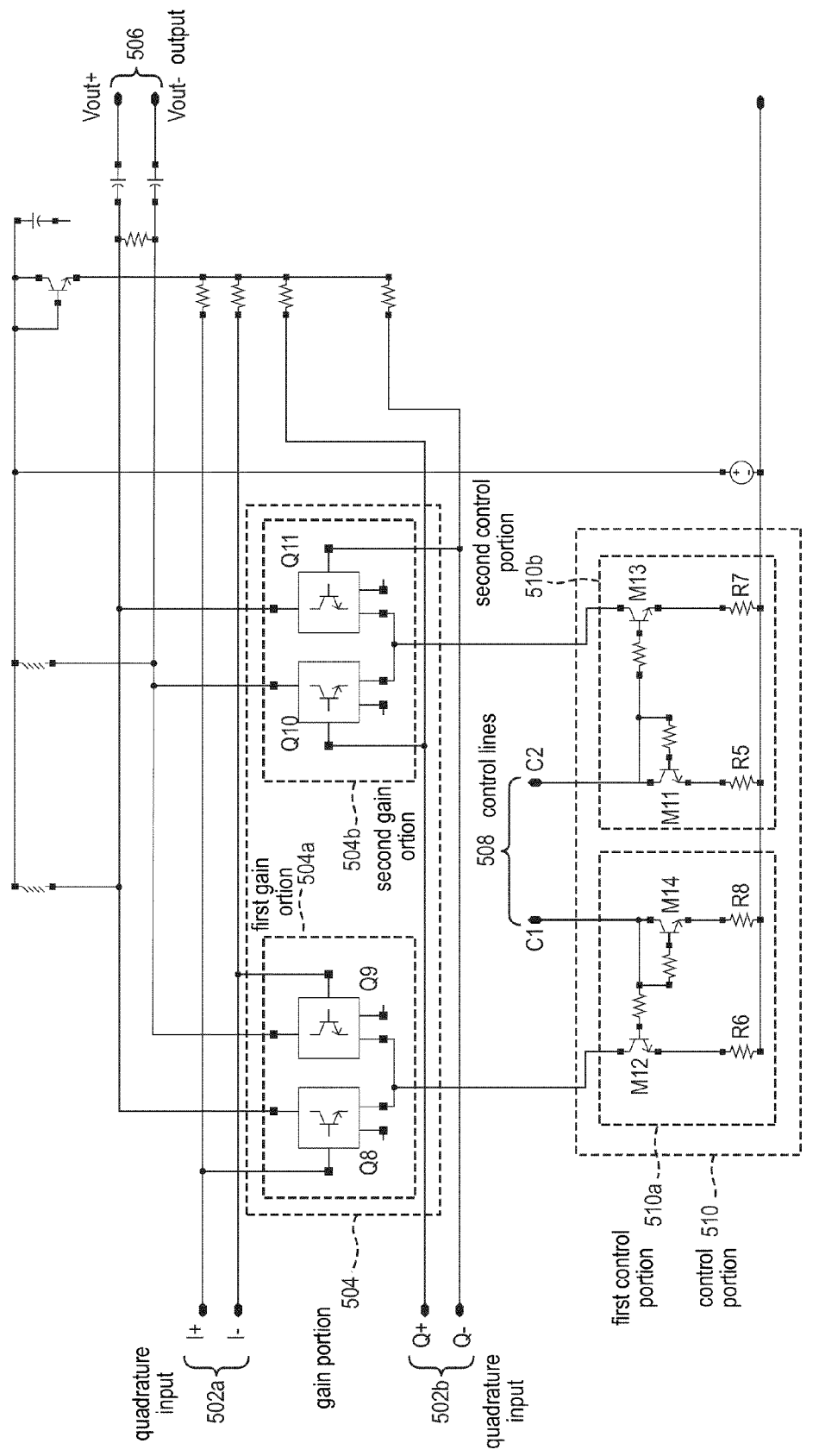
FIG. 5 is a circuit diagram of a phase shifter component, according to an exemplary embodiment.

Referring now to FIG. 5, a circuit diagram of a phase shifter component 500 is shown, according to an exemplary embodiment. The phase shifter component 500 has a gain portion 504 and a control portion 510. The phase shifter component 500 has differential quadrature inputs 502a and 502b for signals I+, I−, Q+ and Q−, and is configured to create a composite differential signal Vout by varying the amplitude of the signals I+ or I−, and Q+ or Q−. Thus, the phase shifter component 500 of FIG. 5 has two inputs, 502a and 502b, for signals I and Q, where 310a selects if it receives I+ or I−, and 310b selects Q+ or Q−.

The phase shifter component 500 of FIG. 5 has a gain portion 504 which may include transistors or other circuit elements configured to apply gains or attenuations to the signals received at inputs 502. For example, gain portion 504 may include transistor elements Q8-Q11. For example, the emitters of transistor elements Q8, Q9 may be coupled, and share one bias source and one input signal, and the emitters of Q11, Q10 may be coupled, and share one bias source and one input signal, thereby forming two transistor element pairs (e.g., a first pair, Q8, Q9 and a second pair Q11, Q10). Thus the independent gain/bias pairs have their outputs coupled.

Further, the control portion 510 of the phase shifter component 500 of FIG. 5 includes control lines 508 (e.g., control lines c1 and c2). Control lines 508 may be connected to Transistors M11-M14 in control portion 510, which control the currents supplied to the emitters of transistors of gain portion Q8-Q11. Transistors M7-M10 may also have resistors (e.g., R5-R8) connected to them respectively, to raise the common mode impedance at the drains of transistors M13-M14. In another embodiment, resistors R5-R8 may be omitted and a short used instead. Transistors M11-M14 may be controlled to vary the amount of current supplied to gain portion 504 and, hence, the amount of amplitude control applied by gain portion 504. In various embodiments, control lines 508 may receive control signals from a control circuit via one or more on-die CMOS SPI, or DACs The gain portion 504 comprises a first gain portion 504a, including the two transistor elements Q8 and Q9, and a second gain portion 504b, including the two transistor elements Q10 and Q11. The first gain portion 504a provides the gain for the differential signal I, while the second gain portion 504b provides the gain for the differential signal Q. Further the control portion 510 includes a first control portion 510a, connected to the first gain portion 504a, and configured to control the gain of the first gain portion 504a. The control portion 510 also includes a second control portion 510b, connected to the second gain portion 504b, and configured to control the gain of the second gain portion 504b. The first control portion 510a includes transistors M12 and M14, and resistors R6 and R8. The second control portion 510b includes transistors M11 and M13, and resistors R5 and R7.

The outputs of the first gain portion 504a and the second gain portion 504b may be connected to one another combining the amplified I (I+, I−) and Q (Q+, Q−) into a differential output signal Vout. The first gain portion 504a and the second gain portion 504b are configured to provide variable gain control over the I and Q component signals by varying the input current to the first gain portion 504a and the second gain portion 504b.

The gain of the first and second gain portions 504a and 504b may be controlled to determine the amount of phase shift applied to the output signal by varying the contribution, or gain, from the input I and Q signals received at the inputs 502a and 502b. In particular, the ratio of amplification by the first gain portion 504a to the amplification by the second gain portion 504b may be varied to control the phase shift of the combined I and Q. For example changing the I vs Q amplification ratio via control of the first and second gain portions 504a and 504b makes the output signal phase more aligned with one of the inputs versus the other. In other words, the gain of the first and second gain portions 504a and 504b may be controlled such that the zero degree component (the I signal) is emphasized and the ninety degree component (the Q signal) is deemphasized in the output signal, Vout, that results at output 506. Similarly, decreasing the I/Q amplification ratio via control of the first and second gain portions 504a and 504b may increase the phase of the output signal. Making the I/Q amplification ratio 1, such that the I and Q contributions are equal, provides a combined output signal between the two inputs I and Q.

Super Transistors

All of the RF transistors in the variable amplifier controller 400 in FIG. 4 and the phase shifter component 500 of FIG. 5 may be single transistors or may be three-transistors configured into a "super transistor," such as is described in U.S. Pat. No. 8,937,495 to Wyse et al. entitled FREQUENCY ENHANCED EMITTER COUPLED LOGIC TOPOLOGY, particularly with respect to FIG. 3 of U.S. Pat. No. 8,937,495 to Wyse et al. Such "super transistors" allow for significantly increased bandwidth capability, such as about doubling the bandwidth capability, in the variable amplifier controller 400 in FIG. 4, and the phase shifter component 500.

Phase Shifter Topology Parameters

The phase shifter topology discussed above with a pair of variable controller amplifiers which respectively provide the I (I+, I−) and Q (Q+, Q−) components to the phase shifter component provides advantages. Since the pair of variable controller amplifiers respectively provide the I and Q inputs into the phase shifter component, the phase shifter component itself need not perform a 180° phase shift internally for I and Q. Rather the I+ or I− and Q+ or Q− are fed into the phase shifter component, thereby allowing the simplified phase shifter topology to create a full 360° phase controlled output with less complexity and voltage overhead and parasitic loading of the circuit.

Because the variable controller amplifiers function to perform the 180° phase shift instead of the phase shifter component, each of the gain portions for the I and Q components respectively of the phase shifter component need be only be a pair of transistors, as compared to prior systems with two pairs of transistors for providing gain to each of the I and Q components (eight transistors in all).

The new phase shifter component with only one pair of transistors for gain of each of the I and Q components may have a reduced voltage overhead. Thus, the voltage overhead of the phase shifter may be reduced to 2 Vice's, allowing for operation at lower voltages for the same power output swing.

Further, because each component I and Q need only a pair instead of two pair of transistors for phase control, the parasitic loading of the unused pair can be eliminated thus increasing the bandwidth capability for a given power capability by close to 100%. Because each variable controller amplifier is already in the cascade, and is inherently broadband, having one for the I feed and another for the Q feed into the phase shifter, there is no impact to parasitics or bandwidth. The net effect of this new cascade approach and new phase shifter circuit topology is increased bandwidth for the phase shifter component of the cascade, and more output power capability of the phase shifter.

Figure 6:
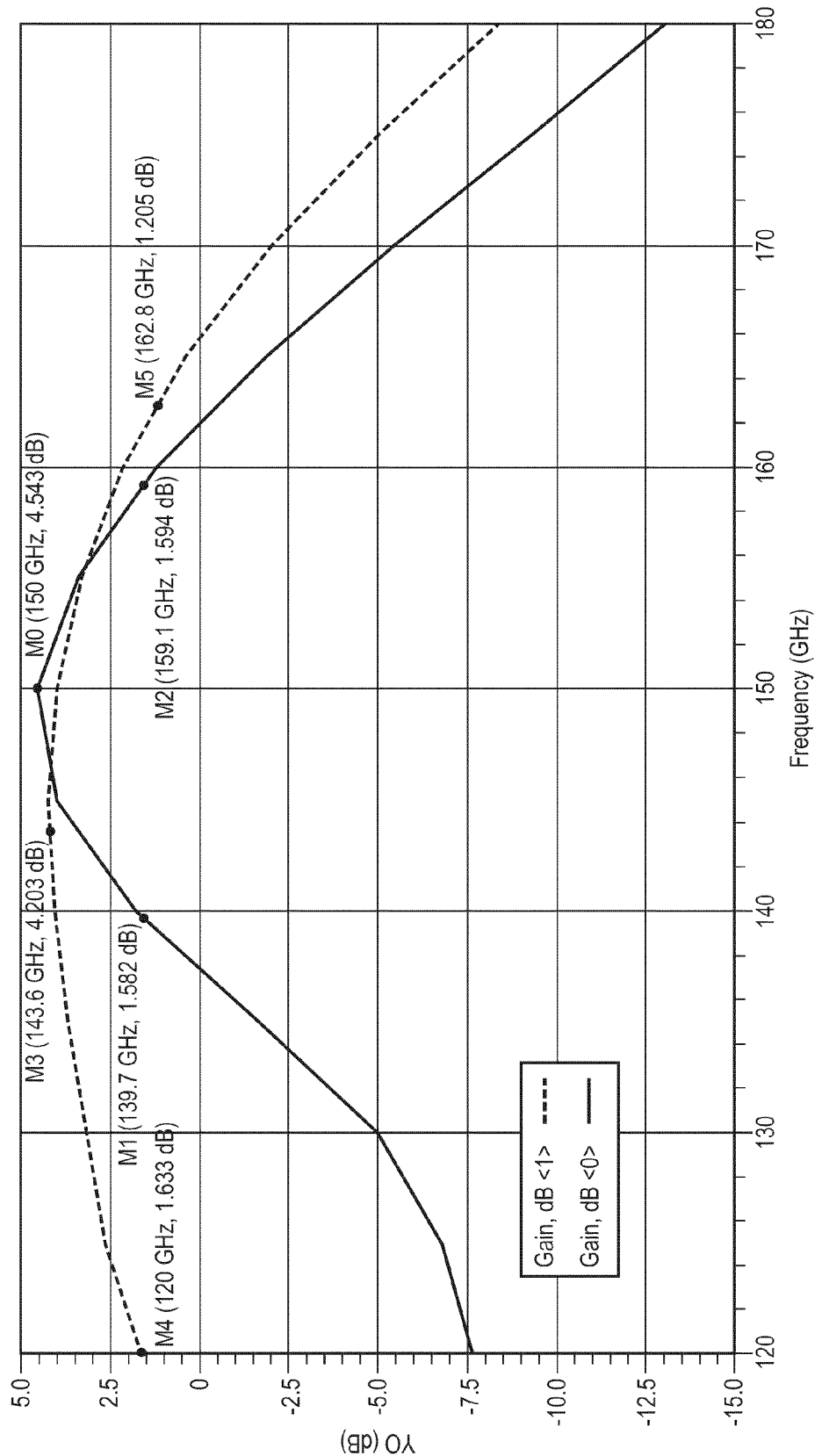
FIG. 6 is a graph comparing the gain as a function of operating frequency for a circuit according to a design using the present invention as compared to a prior design.

FIG. 6 is a graph comparing the gain as a function of operating frequency for a circuit according to a design using the present invention as compared to a prior design. The design according to the present invention includes a cascade of I/Q generating block, variable amplitude controllers and component phase shifter circuitry. The prior design has a 4 quadrant phase shifter topology. As can be seen, the circuit according to a design using the present invention has about a 100% increase in bandwidth about a 150 GHz center frequency of operation as compared to the prior design.

Figure 7A:
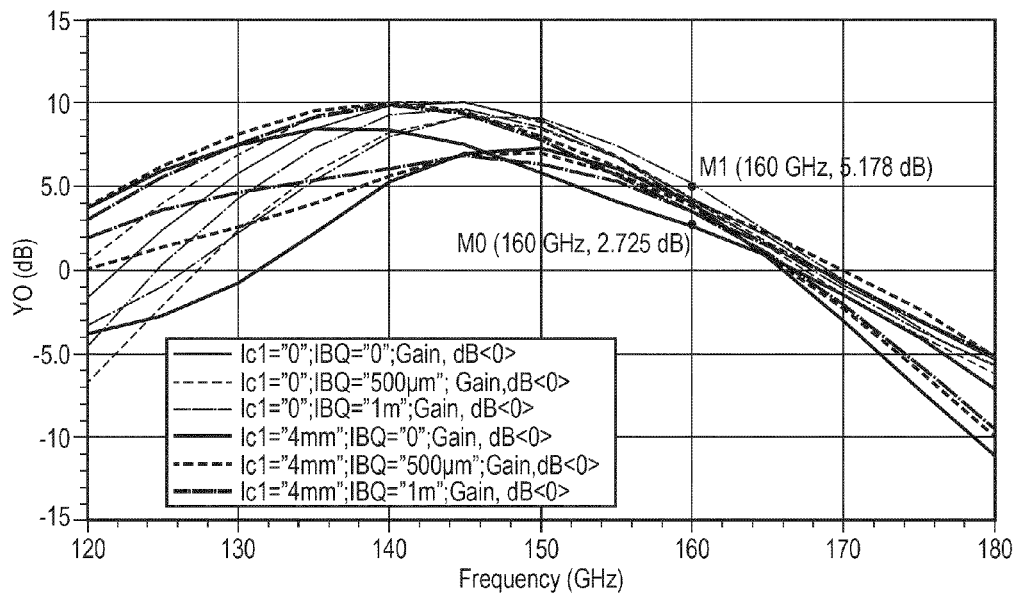
FIG. 7A is a graph illustrating the cascaded system gain as a function of frequency when controlling phase over a full 360 degree rotation.
Figure 7B:
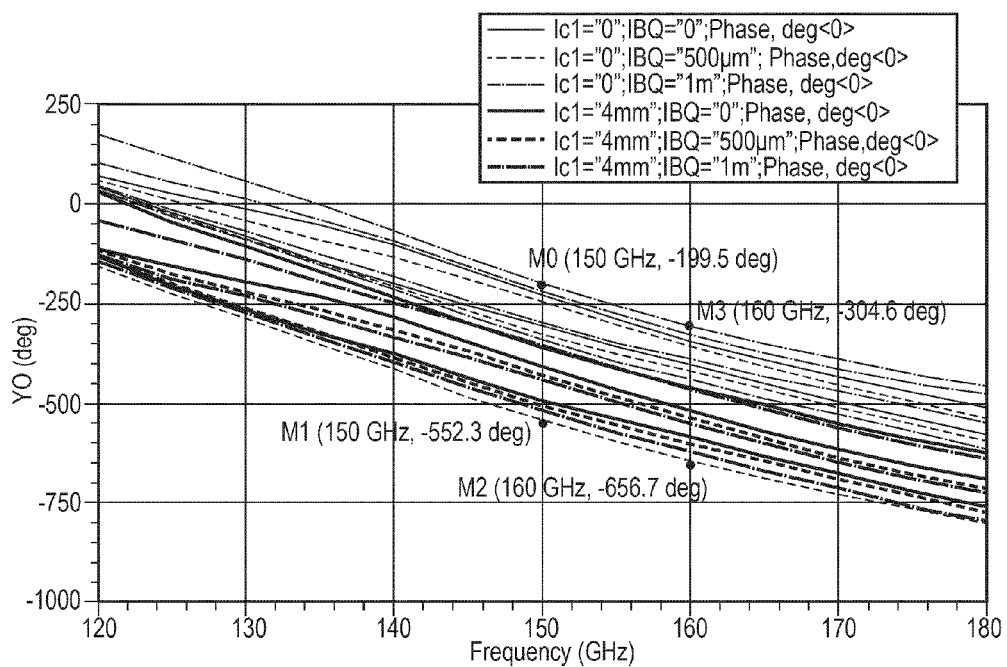
FIG. 7B is a graph illustrating the phase sweep that corresponds to the gain in FIG. 7A.

FIGS. 7A and 7B illustrate the cascaded system gain and phase, respectively, when controlling phase over a 360 degree rotation as a function of frequency. FIG. 7A shows the gain variation swept across the full 360 phase rotation, while FIG. 7B shows the phase sweep that corresponds to the gain in FIG. 7A. The gain was calculated for the condition Ib1+Ib2=Ibmax, but could be further calibrated for maximum flatness. With the fine tuning of gain capability of each variable amplitude controller on each I and Q feed, along with the phase shifter component I/Q tuning capability, the ability to calibrate a perfectly flat gain/phase response at a given frequency can be increased tremendously.

The embodiments of the invention have been described in detail with particular reference to preferred embodiments thereof, but it will be understood by those skilled in the art that variations and modifications can be effected within the spirit and scope of the invention.

What is claimed is:

1. A phase shifter topology circuit comprising:
   an I/Q generator configured to receive an input signal, and generate an in-phase (I) signal and a quadrature-phase (Q) signal based on the input signal;
   a first variable amplitude amplifier arranged to receive the I signal from the I/Q generator, and configured to adjust the phase of and amplify the I signal to provide an inphase I signal and an outphase I signal 180° out of phase with the inphase I signal;
   a second variable amplitude amplifier arranged to receive the Q signal from the I/Q generator, and configured to adjust the phase of and amplify the Q signal to provide an inphase Q signal and an outphase Q signal 180° out of phase with the inphase Q signal; and
   a phase shifter component arranged to selectively receive the outphase I signal or the inphase I signal from the first variable amplitude amplifier and to selectively receive the outphase Q signal or the inphase Q signal from the second variable amplitude amplifier, and configured to control the gain of the received outphase or inphase I signal and the received outphase or inphase Q signal to provide a composite output signal with a desired phase shift between 0° and 360°.

2. The phase shifter topology circuit of claim 1, where the phase shifter component comprises:
   a first gain portion comprising only two transistor elements arranged to amplify the received outphase or inphase I signal; and
   a second gain portion comprising only two transistor elements arranged to amplify the received outphase or inphase Q signal.

3. The phase shifter topology circuit of claim 2, wherein each of the transistor elements of the first and second gain portions comprises three transistors configured to be a super transistor.

4. The phase shifter topology circuit of claim 1, wherein the first variable amplitude amplifier has a first gain portion configured to amplify the I signal, and the second variable amplitude amplifier has a second gain portion configured to amplify the Q signal.

5. The phase shifter topology circuit of claim 4, wherein the first gain portion comprises two pairs of transistors cross coupled with each other, and the second gain portion comprises two pairs of transistors cross coupled with each other.

6. The phase shifter topology circuit of claim 5, wherein each of the transistors of the pairs of transistors of the first and second gain portions comprises three transistors configured to be a super transistor.

7. The phase shifter topology circuit of claim 1, further comprising a control circuit configured to provide control signals to the first and second variable amplitude amplifiers and the phase shifter component to control the amplification provided by the first and second variable amplitude amplifiers and the phase shifter component.

8. The phase shifter topology circuit of claim 5, wherein the first variable amplitude amplifier has a first control portion configured to provide current to the transistors of the first gain portion to control the amplification provided by the first gain portion, and the second variable amplitude amplifier has a second control portion configured to provide current to the transistors of the second gain portion to control the amplification provided by the second gain portion.

9. The phase shifter topology circuit of claim 2, wherein the phase shifter component has a first control portion configured to provide current to the transistors of the first gain portion to control the amplification provided by the first gain portion, and a second control portion configured to provide current to the transistors of the second gain portion to control the amplification provided by the second gain portion.

10. A phase shifter component, comprising:
    inputs arranged to selectively receive an inphase component of an in-phase (I) signal or an outphase I signal 180° out of phase with the inphase I signal, and to selectively receive an inphase component of a quadrature-phase (Q) signal or an outphase Q signal 180° out of phase with the inphase Q signal;
    a first gain portion comprising only two transistor elements arranged to amplify the received outphase or inphase I signal; and
    a second gain portion comprising only two transistor elements arranged to amplify the received outphase or inphase Q signal, and
    the first and second gain portions configured to control the gain of the received outphase or inphase I signal and the received outphase or inphase Q signal, respectively, to provide a composite output signal with a desired phase shift between 0° and 360°.

11. The phase shifter component of claim 10, wherein each of the transistor elements of the first and second gain portions comprises three transistors configured to be a super transistor.

12. The phase shifter component of claim 10, further comprising:
    a first control portion configured to provide current to the transistors of the first gain portion to control the amplification provided by the first gain portion, and
    a second control portion configured to provide current to the transistors of the second gain portion to control the amplification provided by the second gain portion.

13. An electronically scanned antenna array comprising:
    a plurality of antenna elements configured to transmit a beam comprising signals emitted by the antenna elements; and
    a plurality of phase shifter topology circuits configured to adjust the amplitudes of signals provided to the antenna elements for emission, wherein each phase shifter topology circuit comprises:
      an I/Q generator configured to receive an input signal, and generate an in-phase (I) signal and a quadrature-phase (Q) signal based on the input signal;
      a first variable amplitude amplifier arranged to receive the I signal from the I/Q generator, and configured to adjust the phase of and amplify the I signal to provide an inphase I signal and an outphase I signal 180° out of phase with the inphase I signal;
      a second variable amplitude amplifier arranged to receive the Q signal from the I/Q generator, and configured to adjust the phase of and amplify the Q signal to provide an inphase Q signal and an outphase Q signal 180° out of phase with the inphase Q signal; and
      a phase shifter component arranged to selectively receive the outphase I signal or the inphase I signal from the first variable amplitude amplifier and to selectively receive the outphase Q signal or the inphase Q signal from the second variable amplitude amplifier, and configured to control the gain of the received outphase or inphase I signal and the received outphase or inphase Q signal to provide a composite output signal with a desired phase shift between 0° and 360°.

14. The electronically scanned antenna array of claim 13, where the phase shifter component comprises:
  a first gain portion comprising only two transistor elements arranged to amplify the received outphase or inphase I signal; and
  a second gain portion comprising only two transistor elements arranged to amplify the received outphase or inphase Q signal.

15. The electronically scanned antenna array of claim 14, wherein each of the transistor elements of the first and second gain portions comprises three transistors configured to be a super transistor.

16. The electronically scanned antenna array of claim 13, wherein the first variable amplitude amplifier has a first gain portion configured to amplify the I signal, and the second variable amplitude amplifier has a second gain portion configured to amplify the Q signal.

17. The electronically scanned antenna array of claim 16, wherein the first gain portion comprises two pairs of transistors cross coupled with each other, and the second gain portion comprises two pairs of transistors cross coupled with each other.

18. The electronically scanned antenna array of claim 17, wherein each of the transistors of the pairs of transistors of the first and second gain portions comprises three transistors configured to be a super transistor.

19. The electronically scanned antenna array of claim 13, further comprising a control circuit configured to provide control signals to the first and second variable amplitude amplifiers and the phase shifter component to control the amplification provided by the first and second variable amplitude amplifiers and the phase shifter component.

20. The electronically scanned antenna array of claim 14, wherein the phase shifter component has a first control portion configured to provide current to the transistors of the first gain portion to control the amplification provided by the first gain portion, and a second control portion configured to provide current to the transistors of the second gain portion to control the amplification provided by the second gain portion.

* * * * *